United States Patent
Jeong et al.

(10) Patent No.: US 7,893,899 B2
(45) Date of Patent: Feb. 22, 2011

(54) ORGANIC LIGHT EMITTING DIODE DISPLAY AND FABRICATING METHOD THEREOF

(75) Inventors: Seoni Jeong, Youngin-si (KR); Michael Choi, Youngin-si (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 773 days.

(21) Appl. No.: 11/716,805

(22) Filed: Mar. 12, 2007

(65) Prior Publication Data

US 2008/0170013 A1    Jul. 17, 2008

(30) Foreign Application Priority Data

Jan. 15, 2007    (KR) .................... 10-2007-0004437

(51) Int. Cl.
G09G 3/32    (2006.01)
(52) U.S. Cl. ..................................... 345/82
(58) Field of Classification Search ............. 345/76–83; 315/169.1–169.4
See application file for complete search history.

(56) References Cited

U.S. PATENT DOCUMENTS

| | | | | |
|---|---|---|---|---|
| 6,061,105 | A * | 5/2000 | Nakagawa | .................... 349/40 |
| 2004/0075094 | A1 * | 4/2004 | Yamazaki et al. | ............. 257/72 |
| 2004/0256996 | A1 | 12/2004 | Osame et al. | |
| 2005/0087769 | A1 | 4/2005 | Yamazaki et al. | |
| 2005/0151194 | A1 | 7/2005 | Chen et al. | |
| 2005/0196711 | A1 * | 9/2005 | Shiroguchi et al. | .......... 430/330 |
| 2006/0022601 | A1 | 2/2006 | Kitazawa | |
| 2006/0103772 | A1 | 5/2006 | Lee | |
| 2006/0169973 | A1 * | 8/2006 | Isa et al. | ........................ 257/40 |
| 2006/0194382 | A1 * | 8/2006 | Hayashi | ...................... 438/197 |
| 2006/0231527 | A1 * | 10/2006 | Takayama et al. | ............. 216/62 |
| 2006/0255345 | A1 * | 11/2006 | Sakakura et al. | .............. 257/88 |
| 2006/0278929 | A1 | 12/2006 | Liu et al. | |
| 2007/0065996 | A1 * | 3/2007 | Sato et al. | ................... 438/149 |
| 2009/0090910 | A1 * | 4/2009 | Moriwaki | ..................... 257/59 |

FOREIGN PATENT DOCUMENTS

| | | |
|---|---|---|
| JP | 06-289417 A | 10/1994 |
| JP | 07-191349 A | 7/1995 |
| JP | 2005-150105 A | 6/2005 |
| JP | 2005-258423 A | 9/2005 |
| KR | 10-2005-0122698 A | 6/2004 |
| KR | 1020050090732 A | 9/2005 |

* cited by examiner

*Primary Examiner*—Chanh Nguyen
*Assistant Examiner*—Jeffrey Parker
(74) *Attorney, Agent, or Firm*—Knobbe Martens Olson & Bear LLP

(57) ABSTRACT

An organic light emitting diode display and a fabricating method thereof are disclosed. Embodiments provide an organic light emitting diode display and a fabricating method thereof which prevents a pixel and a driver included in the organic light emitting diode display from being damaged due to an electrostatic discharge by forming a protective layer along at least one edge region of a substrate having a pixel region and a non-pixel region.

29 Claims, 11 Drawing Sheets

ORGANIC LIGHT EMITTING DIODE DISPLAY AND FABRICATING METHOD THEREOF

CROSS-REFERENCE TO RELATED APPLICATION

This application claims priority to and the benefit of Korean Patent Application No. 10-2007-0004437, filed Jan. 15, 2007, the entire content of which is incorporated herein by reference.

BACKGROUND

1. Field of the Invention

The field relates to an organic light emitting diode display and a fabricating method thereof, and in particular, an organic light emitting diode display and a fabricating method thereof which includes a protection circuit for preventing a pixel and a driver included in an organic light emitting diode display from being damaged by an electrostatic discharge.

2. Description of the Related Technology

An organic light emitting diode display is one of flat panel displays using an Organic Light Emitting Device (OLED) which emits a light by recombination of the electrons provided from a cathode and the holes provided from an anode. Such an organic light emitting diode display has the advantages such as a thin thickness, a wide viewing angle, and a very fast response.

The organic light emitting diode display is classified into a passive matrix display and an active matrix display depending on a driving method. The passive matrix method is a method, in which an anode and a cathode are formed vertically on a substrate, and a line is selected, thereby driving the diode. On the contrary, the active matrix method is a method which provides a driving current corresponding to a data signal to an organic light emitting device (OLED) by using a thin film transistor (TFT) formed in each pixel, and light is emitted from the organic light emitting device (OLED) by the driving current, thereby an image is displayed, and because of stable brightness, the power consumption is low as compared with the passive matrix method. Accordingly, there is an advantage that it is very useful for applications of a high resolution and a large display.

A conventional organic light emitting diode display includes a pixel region in which the pixels are arranged in a matrix format, and a non-pixel region having a power source and a driver for driving the pixels. The pixels in the pixel region include a thin film transistor and an organic light emitting diode required for driving or switching. The pixel region and the non-pixel region are coupled each other via multiple lines.

The conventional organic light emitting diode display described above is fabricated through at least a step of forming a thin film transistor, a step of forming an organic light emitting diode, an encapsulation step, and a moduling step. In the organic light emitting diodes display, while these steps are being performed, static electricity can be generated due to environmental factors inside and outside. The static electricity can be generated during almost all fabricating processes including deposition, etching and etc. for fabricating the organic light emitting diode display, or can be generated due to outside environment while an image is being displayed on the organic light emitting diode display.

In the conventional organic light emitting diodes display, there is a problem that the inside circuit can be damaged due to the ElectroStatic Discharge (ESD) generated by outside environment during above-mentioned fabricating processes.

SUMMARY OF CERTAIN INVENTIVE ASPECTS

An electrostatic discharge circuit which prevents a pixel and a driver included in an organic light emitting diode display from being damaged by an electrostatic discharge is disclosed.

BRIEF DESCRIPTION OF THE DRAWINGS

The accompanying drawings are included to provide a further understanding, and are incorporated in and constitute a part of this specification. The drawings illustrate embodiments, together with the description, serve to explain the principles disclosed.

DETAILED DESCRIPTION OF CERTAIN INVENTIVE EMBODIMENTS

Certain embodiments will be described more fully with reference to the accompanying drawings, in which embodiments are shown. The invention may, however, be embodied in many different forms and should not be construed as being limited to the embodiments set forth herein; rather, these embodiments are provided so that this disclosure will be thorough and complete.

Referring to the attached drawings and the embodiments, an organic light emitting diode display will be explained in detail as below.

Figure 1:
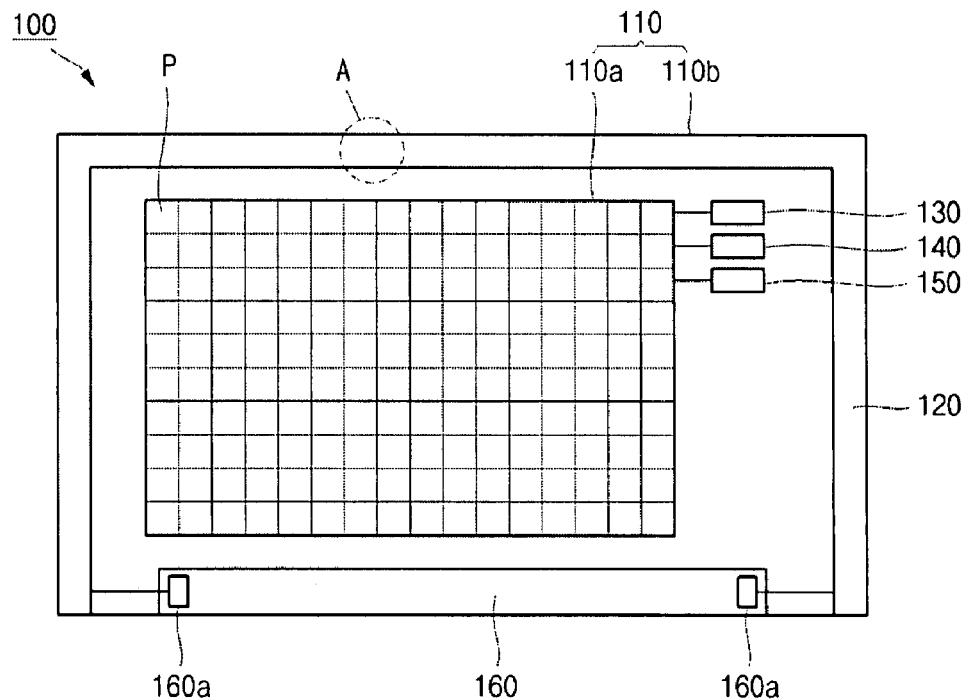
FIG. 1 illustrates a schematic diagram of an organic light emitting diode display according to one embodiment.

FIG. 1 illustrates a schematic diagram of an organic light emitting diode display according to one embodiment.

Referring to FIG. 1, the organic light emitting diode display 100 according to one embodiment includes a pixel region 110a including the pixels P arranged in a matrix format, and a substrate 110 including non-pixel region 110b formed in an outer region of the pixel region 110a; and an electrostatic discharge circuit 120 formed on the non-pixel region 110b.

The substrate 110 includes a pixel region 110a of a substantially rectangular shape, and a non-pixel region 110b formed outside the pixel region 110a. Here, a data driver 130, a scan driver 140, and an emission control driver 150 can be further coupled to the substrate 110.

The pixel region 110a is the region at which a plurality of pixels arranged in a matrix format is driven and then an image is displayed. Each pixel is formed on the region near which a data line, a scan line, and an emission control line intersect. Though the pixels P are not illustrated in detail in the drawings, a driving element formed by a thin film transistor, at least one switching transistor, a storage capacitor, and an organic light emitting diode can be included.

The non-pixel region 110b is formed on a region outside the pixel region 110a on the substrate 110. In the non-pixel region 110b, the electrostatic discharge circuit 120, a data driver 130, a scan driver 140, and an emission control driver 150 for providing a driving signal to data line, a scan line and an emission control line respectively, can be formed. Further, in the non-pixel region 110b, a pad unit 160 can be included for electrically coupling the pixels P, the data driver 130, the scan driver 140, and the emission control driver 150 to an external module.

The electrostatic discharge circuit 120 is formed on the non-pixel region 110b of the substrate 110. The electrostatic discharge circuit 120 can be formed on one side of the end portions of the substrate 110. The electrostatic discharge circuit 120 is formed on each side of the remaining regions except for the region of the substrate 110 on which the pad unit 160, which will be described later, is formed. The electrostatic discharge circuit 120 can be integrally formed for each side of the substrate 110. The electrostatic discharge circuit 120 prevents the inside circuits, for example, a driving element included in the pixels P, the switching transistor, or the organic light emitting diode from being damaged by the electrostatic discharge which can be generated during or after the processes of fabricating the organic light emitting diode display 100. The electrostatic discharge circuit 120 can protect the circuits which are formed in the non-pixel region 110b, for example, the data driver 130, the scan driver 140, the emission control driver 150, and the pad unit 160 that will be explained later. The electrostatic discharge circuit 120 may be formed on the end portions of a substrate as illustrated above, but the present invention is not limited to this formation, and it is natural that the electrostatic discharge circuit 120 can be formed on the other portions of the substrate 110 which are vulnerable to the electrostatic discharge. Embodiments of the structure of the electrostatic discharge circuit 120 will be explained in detail below.

The data driver 130, the scan driver 140, and the emission control driver 150 can be formed as an IC (Integrated Circuit) on the non-pixel region 110b of the substrate 110. The data driver 130, the scan driver 140, and the emission control driver 150 can be formed on the same layer as the pixel region 110a which forms the thin film transistor (not shown) included in the pixels. On the other hand, the data driver 130, the scan driver 140, and the emission control driver 150 can also be formed on another substrate. The respective driver 130, 140, 150 formed on another substrate (not shown) may be any type, for example each of the drivers may be any of TCP (Tape Carrier Package), FPC (Flexible Printed Circuit), TAB (Tape Carrier Package), COG (Chip On Glass) and the equivalents thereof, and can be coupled to the substrate 110. The shape, the formation position and etc. of drivers 130, 140 150 is not limited.

The pad unit 160 is formed in the non-pixel region 110b of the substrate 110. The pad unit 160 is formed on one side of the substrate 110 for coupling the external circuit module (not shown) and the drivers 130, 140, 150 or the external circuit module and the pixels P. The electrostatic discharge circuit 120 can be coupled to a ground pad 160a formed on at least one side of the pad unit 160.

The electrostatic discharge circuit 120 used in the organic light emitting diode display 100 according to one embodiment of the present invention will be explained in greater detail.

Figure 2:
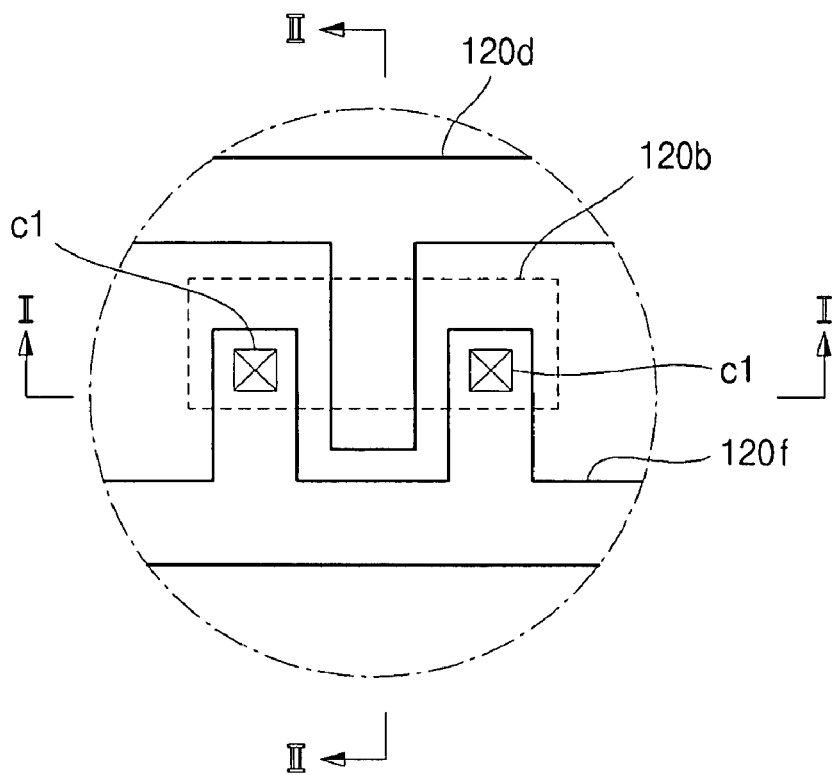
FIG. 2 illustrates a layout showing A portion of FIG. 1.
Figure 3:
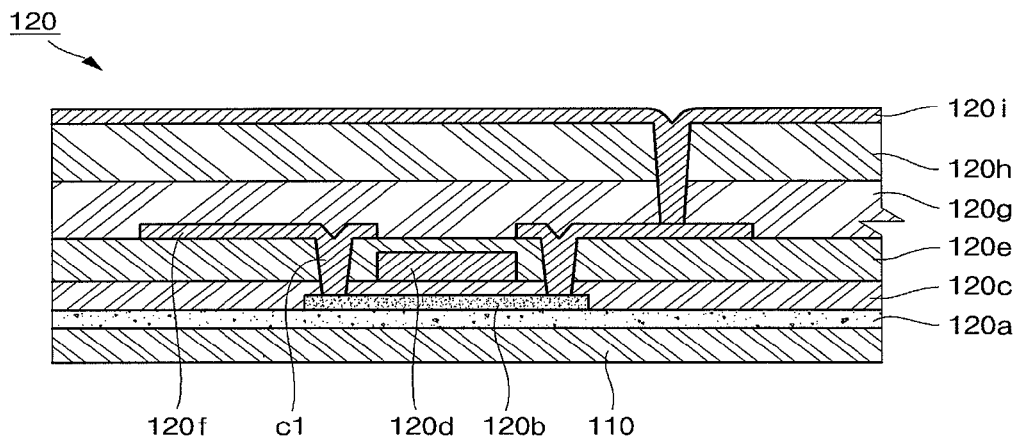
FIG. 3 illustrates a cross-section cut along I-I line of FIG. 2.
Figure 4:
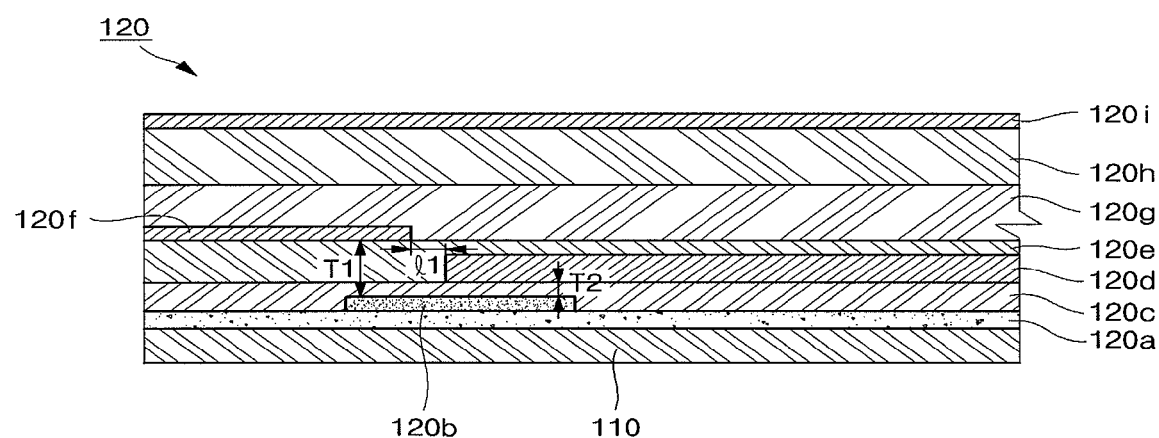
FIG. 4 illustrates a cross-section cut along II-II line of FIG. 2.

FIG. 2 illustrates the layout corresponding to some portions (A of FIG. 1) of the electrostatic discharge circuit 120 of the organic light emitting diode display 100 according to an exemplary embodiment of the present invention, FIG. 3 illustrates a cross-section of the electrostatic discharge circuit 120 cut along I-I line of FIG. 2, and FIG. 4 illustrates a cross-section of the electrostatic discharge circuit 120 cut along II-II line of FIG. 2. The electrostatic discharge circuit 120 explained below means the electrostatic discharge circuit 120 formed on other all portions as well as some portions (A of FIG. 1) of the substrate 110.

Referring to FIG. 2-FIG. 4, the electrostatic discharge circuit 120 used in the organic light emitting diode display 100 according to one embodiment includes a buffer layer 120a formed on the substrate 110, a semiconductor layer 120b formed on the buffer layer 120a, a gate insulating layer 120c formed on the semiconductor layer 120b, a gate electrode 120d formed on the gate insulating layer 120c, an interlayer dielectric layer 120e covering the gate electrode 120d, and a source/drain electrode 120f formed on the interlayer dielectric layer 120e.

In this embodiment, the substrate 110 is formed in a planar type having an upper side and a lower side, and there is thickness of 0.05-1 mm between the upper side and the lower side. If the thickness of the substrate 110 is thinner than 0.05 mm, there is a shortcoming that the substrate can be easily damaged by washing, etching and heat treatment during the processes, or easily influenced by the external forces. On the contrary, if the thickness of the substrate 110 is thicker than 1 mm, there is a shortcoming that it is difficult to apply it to various kinds of diodes displays which are preferably thin. The substrate 110 can be formed, for example, with any one of a glass, a plastic, a stainless steel, a nano-compound material, and the equivalents thereof, but the present invention does not limit the materials of the substrate. The substrate 110 has the pixel region 110a including the thin film transistor r (not shown) and the organic light emitting diode (not shown), and the non-pixel region 110b on which various kinds of drivers are formed.

The buffer layer 120a can prevent humidity ($H_2O$), hydrogen ($H_2$) or oxygen ($O_2$) and etc. from penetrating into the electrostatic discharge circuit 120 including the semiconductor layer 120b, which will be explained later below. For this purpose, the buffer layer 120a can be formed by using at least any of a silicon oxidation film ($SiO_2$), a silicon nitration film ($Si_3N_4$), an inorganic film and the equivalents thereof, and can be fabricated during a semiconductor process, but the present invention does not limit the materials of the buffer layer 120. Further, this buffer layer 120a can be omitted.

The semiconductor layer 120b is formed on the upper side of the buffer layer 120a or the upper side of the substrate 110. The semiconductor layer 120b induces an electrostatic discharge together with the gate electrode 120d and the source/drain electrode 120f which will be explained below. The semiconductor layer 120b can be any of an amorphous silicon, a micro silicon (which has grain size between the amorphous silicon and the polycrystal silicon), an organic material, and the equivalents thereof, and the present invention does not limit the materials of the semiconductor layer 120b.

The gate insulating layer 120c can be formed on the upper side of the semiconductor layer 120b. The gate insulating layer 120c is formed for securing electrical insulation between the gate electrode 120d that will be explained below, and the semiconductor layer 120b. The gate insulating layer 120c can be formed by using at least any of a silicon oxidation film, a silicon nitration film, an inorganic film and the equivalents thereof, and can be obtained during a semiconductor process, but the present invention does not limit the materials of the gate insulating layer 120c. The gate insulating layer 120c can be formed on the buffer layer 120a along the semiconductor layer 120b. Since the gate insulating layer 120c discharges the static electricity by inducing dielectric breakdown of the gate insulating layer 120c to the gate electrode 120d or the source/drain electrode 120f, it is possible to prevent the pixels P in the pixel region 110a and the drivers 130, 140, 150 of the non-pixel region 110b from being damaged by the electrostatic discharge. Because the gate insulating layer 120c has the thickness (T1 of FIG. 4) of approximately 1 μm below is formed between the gate electrode 120d and the semiconductor layer 120b, a dielectric breakdown occurs when relatively low static electricity corresponding to a few hundreds of volts is generated. Accordingly, the organic light emitting diode display 100 can be protected from the electrostatic discharge.

The gate electrode 120d is formed on the upper side of the gate insulating layer 120c. More specifically, the gate electrode 120d can be formed on the region corresponding to the semiconductor layer 120 of the upper side of the gate insulating layer 120c. The gate electrode 120d can be coupled to the ground pad (160a of FIG. 1) included in the pad unit (160 of FIG. 1). The gate electrode 120d can be formed by at least one metal (e.g. Mo, MoW, Ti, Cu, Al, AlNd, Cr, Mo alloy, Cu alloy, Al alloy, etc.), and doped poly-silicon and the equivalents thereof, but the present invention does not limit the materials of the gate electrode 120d.

The interlayer dielectric layer 120e is formed on the upper side of the gate electrode 120d. The interlayer dielectric layer 120e can also be formed on the gate insulating layer 120c formed on inner circumference of the gate electrode 120d. Here, the interlayer dielectric layer 120e can be formed by any one selected from polymer group, plastic group, glass group, and the equivalent groups, but the present invention does not limit the materials of the interlayer dielectric layer 120e. The interlayer dielectric layer 120e can be formed by the material identical to the material of the gate insulating layer 120c. Like the gate insulating layer 120c, the interlayer dielectric layer 120e can experience a dielectric breakdown due to the static electricity introduced via the gate electrode 120d or the source/drain electrode 120f.

The source/drain electrode 120f can be formed on the upper side of the interlayer dielectric layer 120e. Here, an electrically conductive contact c1 penetrating through the interlayer dielectric layer 120e can be formed between the source/drain electrode 120f and the semiconductor layer 120b. The source/drain electrode 120f can be coupled to the semiconductor layer 120b by the conductive contact c1. Here, the horizontal distance (l1 of FIG. 4) can be spaced apart by 1 μm-10 μm between the source/drain electrode 120f and the gate electrode 120d. If the horizontal distance (l1 of FIG. 4) is shorter than 1 μm, since the resistance between the source/drain electrode 120f and the gate electrode 120d becomes low, the voltage level which is protected by the electrostatic discharge circuit 120 becomes low. That is, it will be difficult to control high static electricity of more than thousands of volts. On the contrary, If the horizontal distance (l1 of FIG. 4) is longer than 10 μm, since the resistance is higher, the protected voltage level is higher, but since the region of the electrostatic discharge circuit 120 which can be formed in the non-pixel region 110b is limited, it is desirable that the horizontal distance (l1 of FIG. 4) is controlled to be less than 10 μm. On the other hand, the thickness (T2) having approximately 1 μm can be formed between the source/drain electrode 120f and the semiconductor layer 120b. Since the source/drain electrode 120f is integrally formed such that a source region and a drain region are coupled, it does not operate when the organic light emitting diode display 100 operates normally. The source/drain electrode 120f can be formed by the metal material identical to that of the above-mentioned gate electrode 120d, and the present invention does not limit the materials of the source/drain electrode 120f.

A protective layer 120g and a planarization layer 120h can be further formed on the upper side of the source/drain electrode 120f. The protective layer 120g covers the source/drain electrode 120f and the interlayer dielectric layer 120e, and thus protects the source/drain electrode 120f and the interlayer dielectric layer 120e. The protective layer 120g can be formed of at least one selected from a common inorganic film and the equivalents thereof, but the present invention does not limit the materials of the protective layer 120g. In addition, since the planarization layer 120h covers the protective layer 120g, it is very helpful for flattening the whole surface of the electrostatic discharge circuit. The planarization layer 120h can be formed by coating or depositing at least one selected from BCB (Benzo Cyclo Butene), acryl, and the equivalents thereof. The present invention does not limit the materials or the formation methods of the planarization layer 120h.

The electrode layer 120i can be further formed on the upper side of the planarization layer 120h. The electrode layer 120i is coupled to the source/drain electrode 120f via an electrically conductive via hole v1. When the static electricity is generated, the electrode layer 120i allows the static electricity to be discharged via an electrically conductive via hole v1 and the source/drain electrode 120f. The electrode layer 120i can be formed by a metal material identical to that of the above-mentioned gate electrode layer 120d, and the present invention does not limit the materials of the electrode layer 120i.

Next, the operations of the electrostatic discharge circuit 120 formed according to one embodiment will be explained in greater detail.

Figure 5:
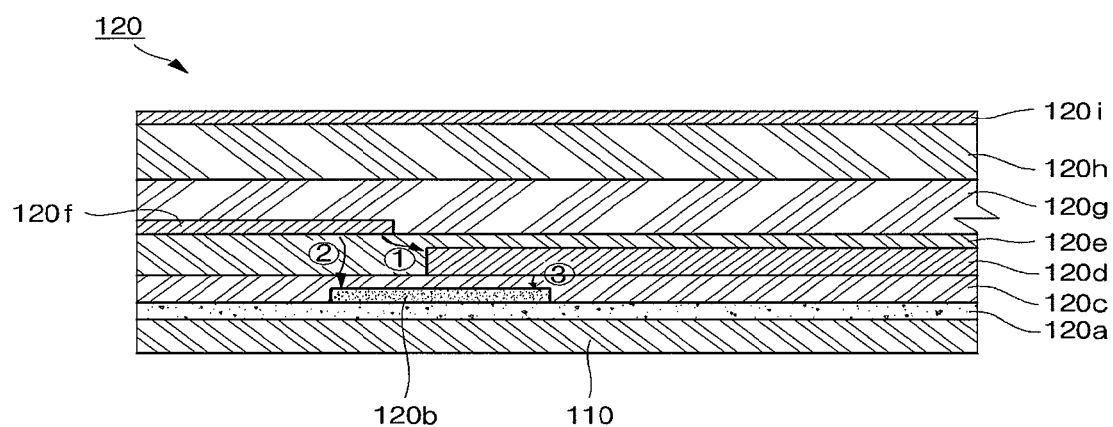
FIG. 5 illustrates a path through which the static electricity is discharged in an organic light emitting diode display according to one embodiment.

FIG. 5 illustrates a path through which the static electricity is discharged in an organic light emitting diode display 100 according to one embodiment. According to the embodiment, the static electricity can be discharged via mainly the first path (①) between the source/drain electrode 120f and the gate electrode 120d, the second path (②) between the source/drain electrode 120f and the semiconductor layer 120b, and the third path (③) between the gate electrode 120d and the semiconductor layer 120b.

The first path (①) is the path through which discharge is performed via the interlayer dielectric layer 120e between the source/drain electrode 120f and the gate electrode 120d, and the static electricity having a relatively high voltage level generated from the source/drain electrode 120f can be swiftly discharged to the direction of the gate electrode 120d. In the interlayer dielectric layer 120e formed between the source/drain electrode 120f and the gate electrode 120d, a dielectric breakdown is generated and thus the electrostatic discharge is shunted. The static electricity generated from the source/drain electrode 120f can be shunted to the ground pad 160a coupled to the gate electrode 120d. The source/drain electrode 120f is spaced apart from the gate electrode 120d by about 1 μm to about 10 μm in the horizontal direction with the interlayer dielectric layer 120e being sandwiched between them. If the horizontal distance (l1) between the source/drain electrode 120f and the gate electrode is shorter than 1 μm, since the resistance between the source/drain electrode 120f and the gate electrode becomes low, the voltage level protected by the electrostatic discharge circuit 120 becomes low. That is, it will be difficult to control high static electricity of more than thousands of volts. On the contrary, if the horizontal distance l1 between the source/drain electrode 120f and the gate electrode is longer than 10 μm, since the resistance is higher, the protected voltage level is higher, but since the region of the electrostatic discharge circuit 120 which can be formed in the non-pixel region 110b is limited, it is desirable that the horizontal distance l1 is controlled to be within 10 μm.

The second path (②) is the path through which discharge is performed via the interlayer dielectric layer 120e and the gate insulating layer 120c between the source/drain electrode 120f and the semiconductor layer 120b. The static electricity having a relatively low voltage level which is generated from the source/drain electrode 120f can be discharged to the direction on which the semiconductor layer 120b is formed. In this case, in the interlayer dielectric layer 120e and the gate insulating layer 120c, as a dielectric breakdown is generated, the electrostatic discharge can be shunted. Since the thickness (T2), which is approximately 1 μm, is formed between the source/drain electrode 120f and the semiconductor layer 120b, it protects an organic light emitting diode display 100 from the static electricity having a relatively low voltage level.

The third path (③) is the path through which discharge is performed via the gate insulating layer 120c between the gate electrode 120d and the semiconductor layer 120b. The static electricity generated from the gate electrode 120d can be discharged to the direction on which the semiconductor layer 120b is formed. In this case, since the dielectric breakdown is generated in the gate insulating layer 120c, it becomes possible to protect the organic light emitting diode display 100 from the electrostatic discharge. Since the thickness (T1), which is approximately 1 μm, is formed between the gate electrode 120d and the semiconductor layer 120b, it becomes possible to protect the organic light emitting diode display 100 from the static electricity having a relatively low voltage. On the other hand, the static electricity generated from the gate electrode 120d does not cause the dielectric breakdown of the gate insulating layer 120c, but can be discharged to the ground pad 160a.

According to above-mentioned organic light emitting diode display, there is an advantage that the electrostatic discharge circuit 120 protects the static electricity ranging from a relatively high level to a relatively low level.

Next, a method for fabricating an organic light emitting diode display 100 according to an exemplary embodiment of the present invention will be explained.

Figure 6:
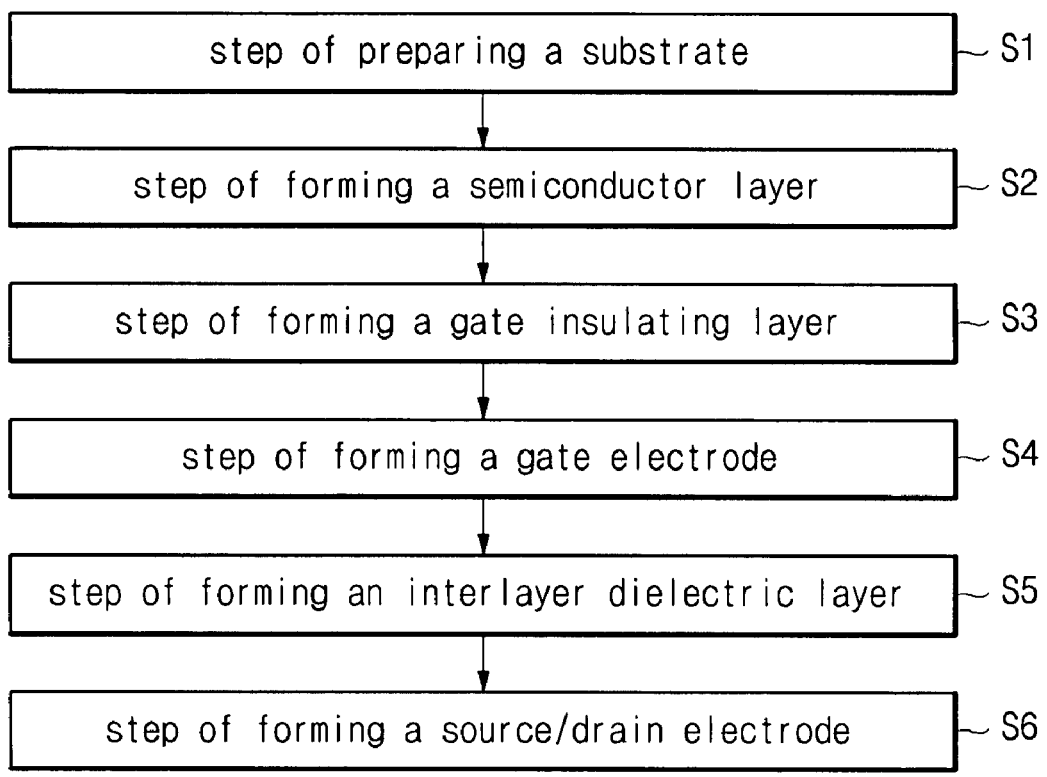
FIG. 6 illustrates a sequential flow chart showing a method for fabricating an organic light emitting diode display according to one embodiment.

FIG. 6 is a sequential flow chart showing a method for fabricating an organic light emitting diode display according to one embodiment. FIGS. 7a to 7f illustrate an organic light emitting diode display formed in sequence according to the fabricating processes of FIG. 6, and FIG. 8 illustrates the pixel region 110a and the non-pixel region 110b of an organic light emitting diode display 100 which is completed according to one embodiment.

Figure 7A:
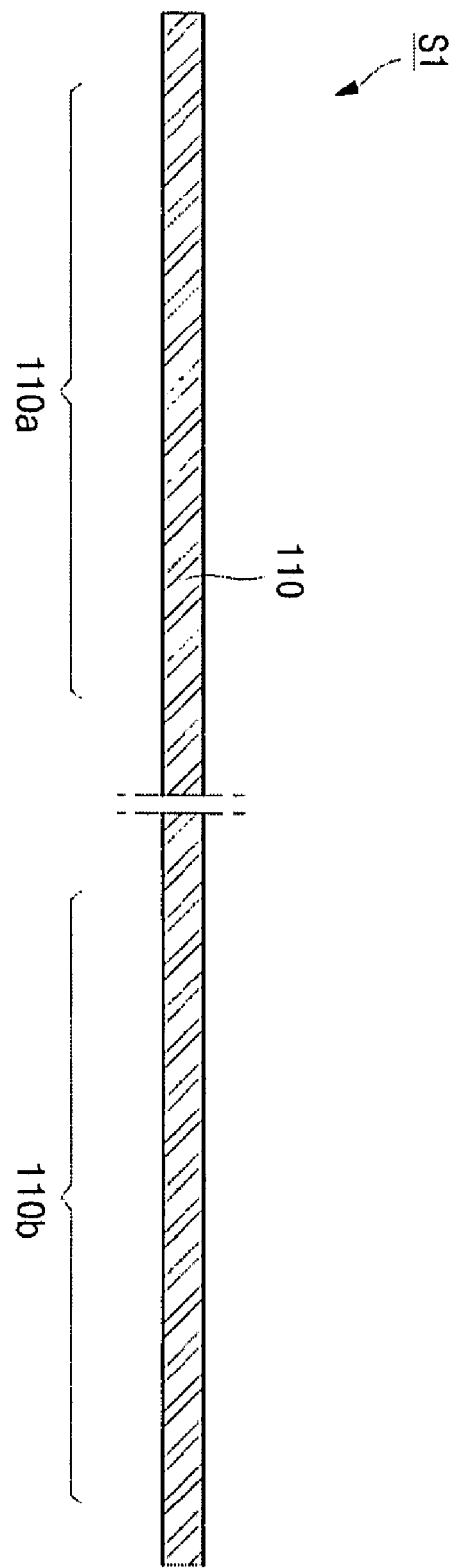
FIGS. 7a to 7f illustrate steps of fabricating an organic light emitting diode display.
Figure 7B:
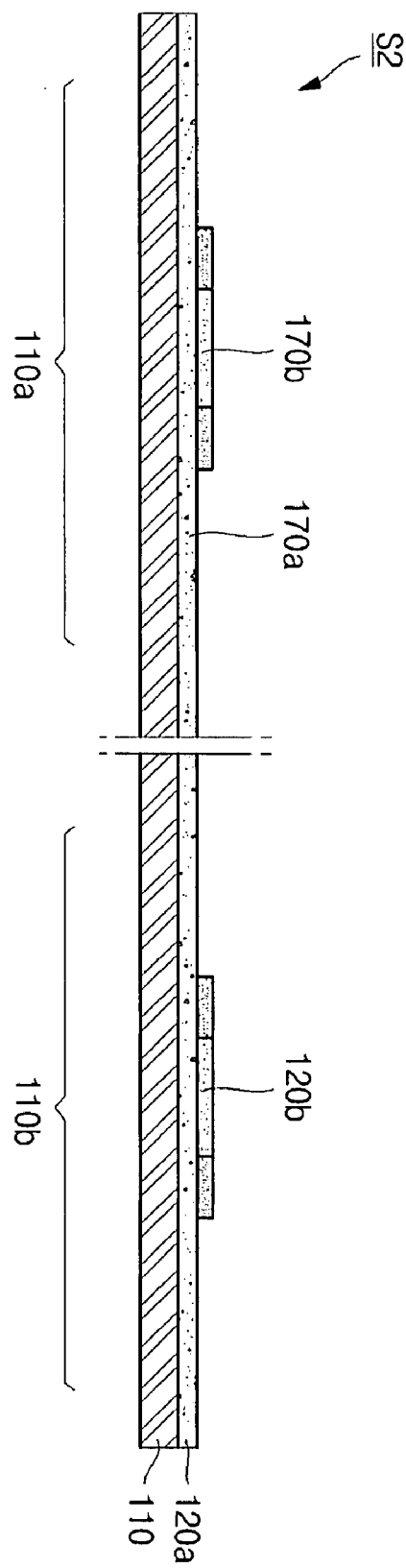
Figure 7C:
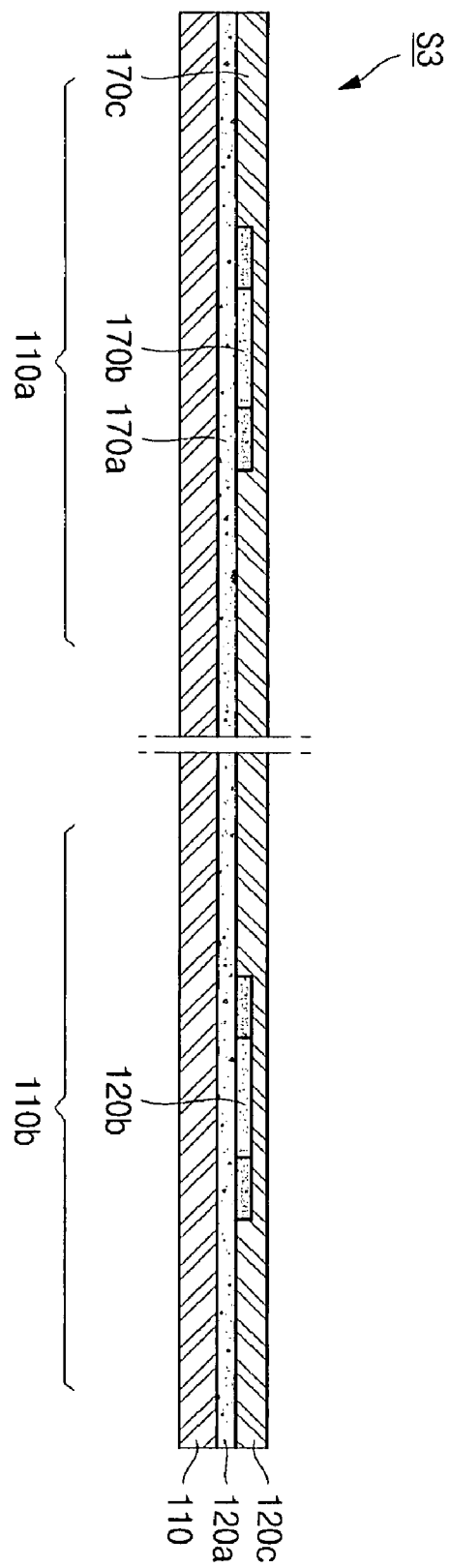
Figure 7D:
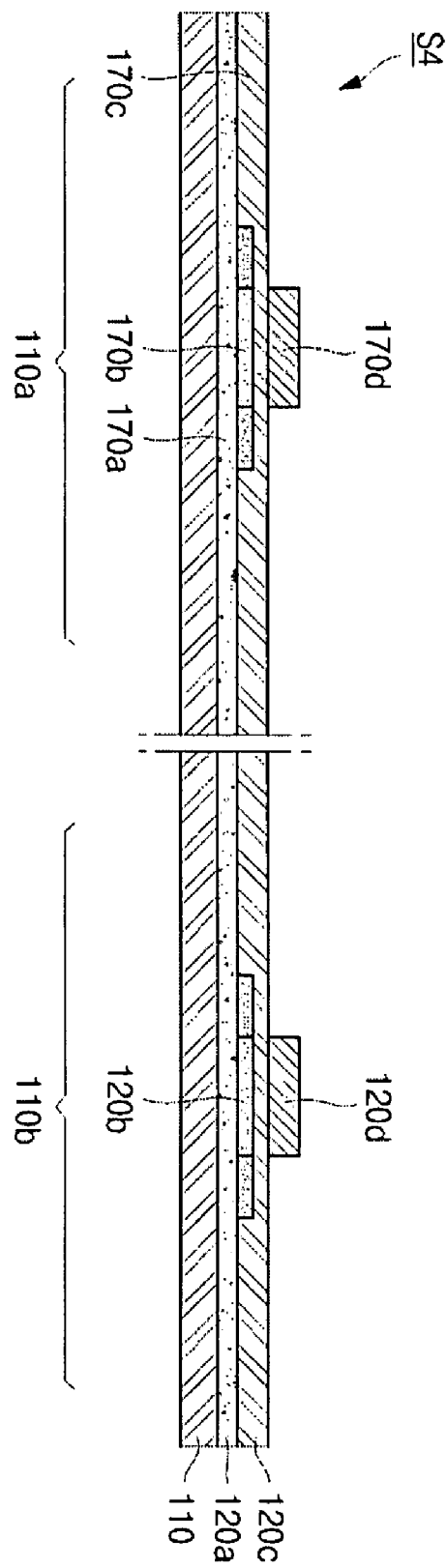
Figure 7E:
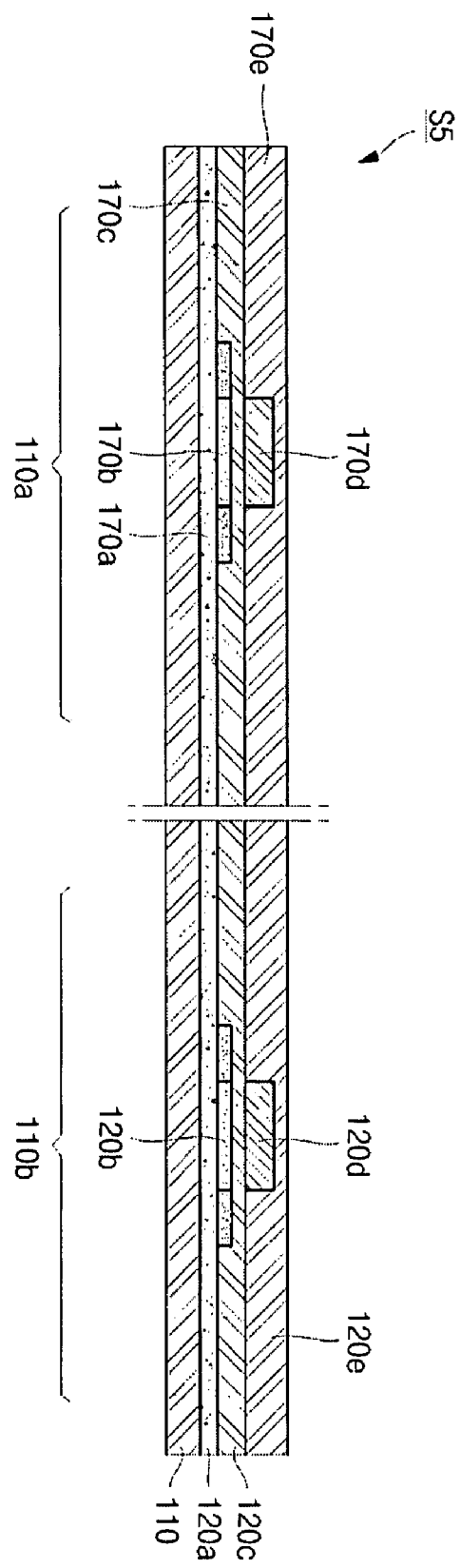
Figure 7F:
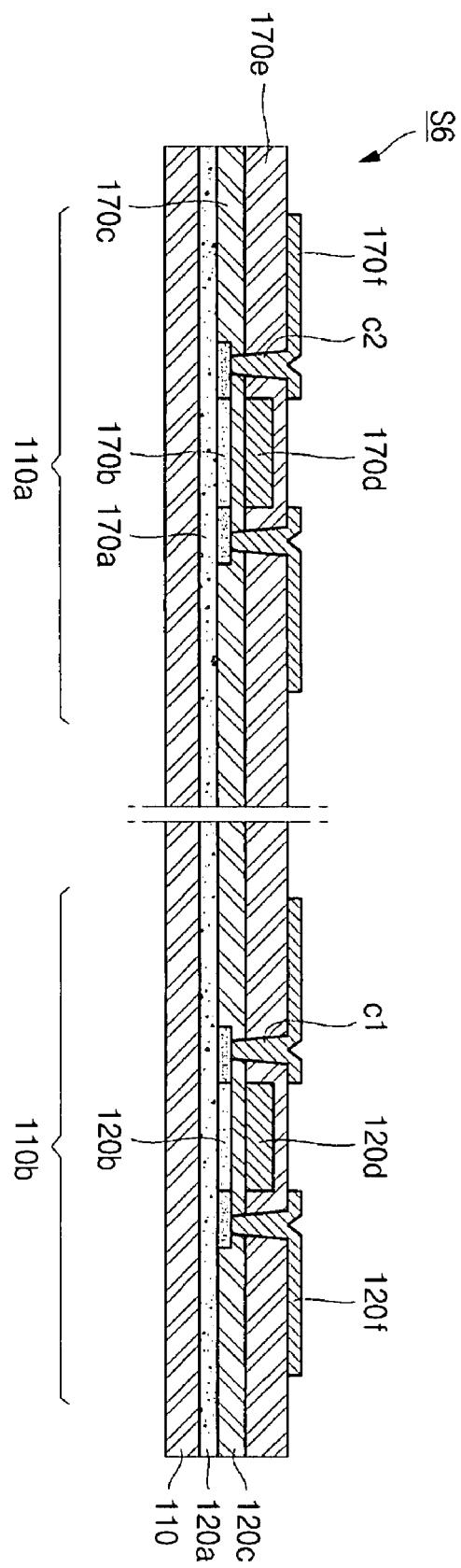
Figure 8:
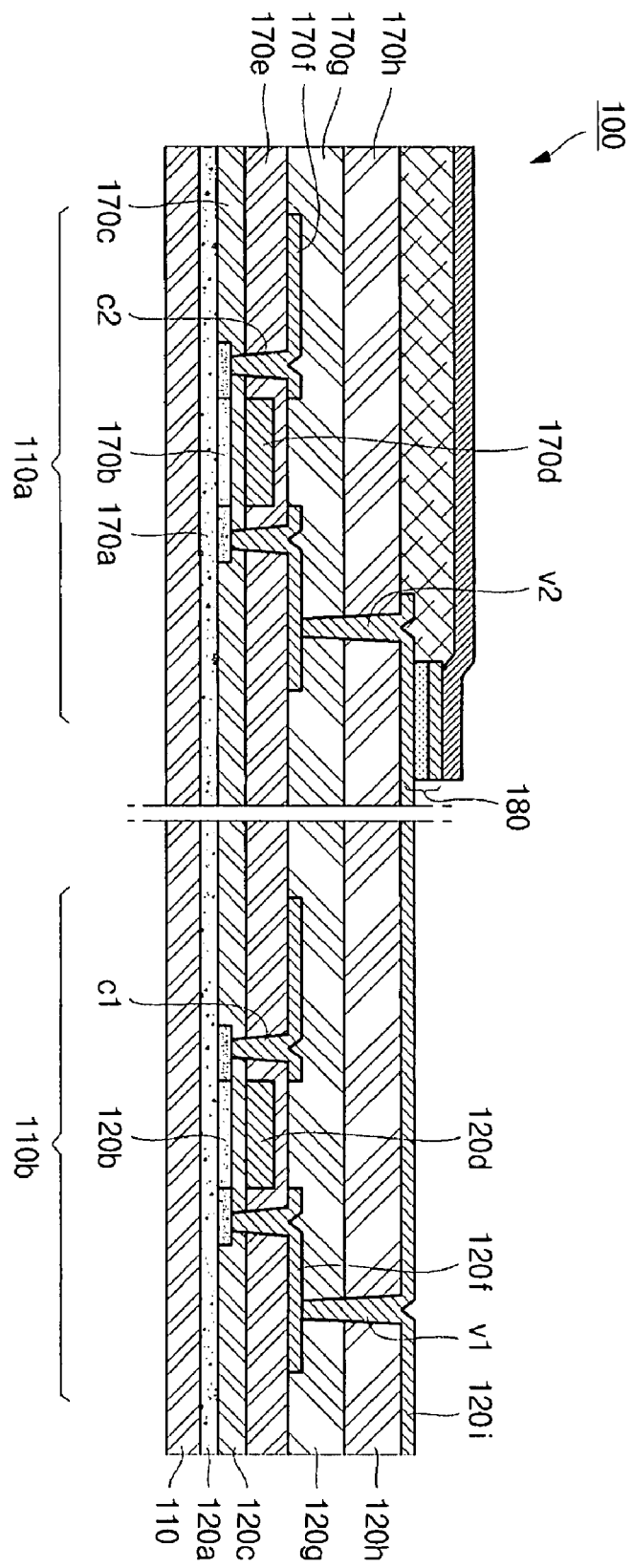
FIG. 8 illustrates a pixel region and a non-pixel region of an organic light emitting diode display fabricated according to one embodiment.

Referring to FIG. 6-FIG. 8, a method for fabricating an organic light emitting diode display according to one embodiment includes the step S1 of preparing a substrate having a pixel region 110a and a non-pixel region 110b, the step S2 of forming a semiconductor layer, the step S3 of forming a gate insulating layer, the step S4 of forming a gate electrode, the step S5 of forming an interlayer dielectric layer, and the step S6 of forming a source/drain electrode, and at least a thin film transistor 170 is formed in the pixel region 110a, and an electrostatic discharge circuit 120 is formed in the non-pixel region 110b.

Referring to FIG. 7a, the step S1 of preparing a substrate is preparing a substrate on the pixel region 110a and the non-pixel region 110b. The step S1 can further include the washing step of preventing foreign substances from being introduced into the substrate 110 having the upper side and the lower side formed in a plate shape, and the pre-compaction step of allowing the substrate not to be easily deformed by heat or pressure at the fabricating processes. It may be preferable that the substrate 110 having the thickness of 0.05 mm-1 mm is prepared. If the thickness of the substrate 110 is thinner than 0.05 mm, there is a shortcoming that the substrate can be easily damaged by washing, etching and heat treatment during the processes, or easily influenced by the external forces. On the contrary, if the thickness of the substrate 110 is thicker than 1 mm, there is a shortcoming that it is difficult to apply it to various kinds of diodes displays which are getting slimmer and slimmer recently. However, these shortcomings can be overcome in some embodiments. The substrate 110 can be classified into the pixel region 110a including the thin film transistor 170 and the organic light emitting diode 180, and the non-pixel region 110b where the electrostatic discharge circuit 120 and various kinds of drivers are formed.

If the substrate 110 is prepared, a buffer layer 170a, 120a having a predetermined thickness is formed on the pixel region 110a and the non-pixel region 110b of the substrate 110, respectively. The buffer layer 170a, 120a can be formed on the pixel region 110a and the non-pixel region 110b of the substrate 110, simultaneously or independently. The buffer layer 170a, 120a prevents foreign substances from being introduced into inside circuits such as the thin film transistor 170, the organic light emitting diode 180, and the electrostatic discharge circuit 120 via the substrate 110. Further, the buffer layer 170a, 120a enables the semiconductor layer 170a, 120a to be formed on the surface thereof smoothly. This buffer layer 170a, 120a can be formed by using at least one of a silicon oxidation film (SiO2), a silicon nitration film (Si3N4), an inorganic film and the equivalents thereof which can be fabricated during a semiconductor process, but the present invention does not limit the materials of the buffer layer 170a, 120a. Here, this buffer layer 170a, 120a can be formed as a multiple structure, and the buffer layer 170a, 120a can be omitted.

Referring to FIG. 7b, at the step S2 of forming a semiconductor layer, the semiconductor layer 170b, 120b are formed on the pixel region 110a and the non-pixel region 110b of the substrate 110. The semiconductor layer 170b, 120b can be formed on the pixel region 110a and the non-pixel region 110b simultaneously or independently. Here, the buffer layer 170a, 120a can further be formed between the substrate 110 and the semiconductor layer 170b, 120b.

The buffer layer 170a, 120a having a predetermined thickness is formed on the pixel region 110a and the non-pixel region 110b of the upper side of the substrate 110, respectively. The buffer layer 170a, 120a can be formed on the pixel region 110a and the non-pixel region 110b simultaneously or independently. The buffer layer 170a, 120a prevents foreign substances from being introduced into inside circuits such as the thin film transistor 170, the organic light emitting diode 180, and the electrostatic discharge circuit 120 via the substrate 110. Further, the buffer layer 170a, 120a enables the semiconductor layer 170a, 120a to be formed on the surface thereof smoothly. This buffer layer 170a, 120a can be formed by using at least one of a silicon oxidation film (SiO2), a silicon nitration film (Si3N4), an inorganic film, and the equivalents thereof which can be fabricated during a semiconductor process, but the present invention does not limit the materials of the buffer layer 170a, 120a. Here, this buffer layer 170a, 120a can be formed as a multiple structure, and the buffer layer 170a, 120a can be omitted.

The semiconductor layer 170b, 120b includes a source region and a drain region (not shown) on opposing sides, and a channel region (not shown) between the source and the drain. The semiconductor layer 170b, 120b can be formed from any of an amorphous silicon, a micro silicon, an organic material, and the equivalents thereof, and the present invention does not limit the materials of the semiconductor layer 170, 120b. For example, the semiconductor layer 170, 120b can be formed as a desired shape at a desired position through a silicon crystallization step, and a polycrystal silicon patterning step.

At the silicon crystallization step, an amorphous silicon is deposited on the upper side of the buffer layer 170a, 120a, and then the amorphous silicon is crystallized into a polysilicon. The polysilicon can be formed through crystallization of a micro silicon. The amorphous silicon can be deposited on the upper side of the buffer layer 170a, 120a by any of a PECVD (Plasma Enhanced Chemical Vapor Deposition), a LPCVD (Low Pressure Chemical Vapor Deposition), a sputtering method, and the equivalents thereof. However, the present invention does not limit the method for forming the amorphous silicon. After the amorphous silicon is deposited on the buffer layer 120, the amorphous silicon is crystallized into a polysilicon according to the methods which will be described below.

The amorphous silicon can be crystallized by any of a laser crystallization method using an ELA (Excimer Laser Annealing), a Metal Induced Crystallization using a promoting material, and a SPC (Solid Phase Crystallization). In addition, a SLS (Sequential Lateral Solidification) in which a mask is added to a conventional laser crystallization method can be employed.

The laser crystallization method is the method which is used very widely, can use the crystallization method of a conventional polycrystal liquid crystal pixel device, and the process is simple, and the technology related to the process has been already developed.

The Metal Induced Crystallization is one of the methods which can perform crystallization at the low temperature without using the laser crystallization method. It is the method in which initially, the metal catalyst such as Ni, Co, Pd, Ti and etc., are deposited or spincoated on the surface of the amorphous silicon, the metal of the metal catalysts is directly deposited into the surface of the amorphous silicon, the phase of the amorphous silicon is changed, and crystallization is realized, and there is an advantage that crystallization can be realized at a low temperature.

According to another type of the Metal Induced Crystallization using a promoting material, there is an advantage that when inserting a metal layer into the surface of the amorphous silicon, the contaminated substance such as a nickel silicide can be prevented from being introduced into the specific region of the thin film transistor by using a mask. This crystallization method is called as a MILC (Metal Induced Lateral Crystallization). A shadow mask can be employed as a mask used in this MILC method, and the shadow mask can be a linear mask or a dot type mask.

Another type of the Metal Induced Crystallization using a promoting material is a MICC (Metal Induced Crystallization with Capping Layer) in which a capping layer is inserted when depositing or spincoating the metal catalyst layer on the surface of the amorphous silicon in order to control the amount of the metal catalyst introduced into the amorphous silicon. A silicon nitride layer can be used as a capping layer. According to the thickness of the silicon nitride layer, the amount of the metal catalyst introduced into the amorphous silicon from the metal catalyst layer is changed. Here, the metal catalyst introduced into the silicon nitride layer can be formed on the entire surface of the silicon nitride layer, or can be formed selectively by using the shadow mask. After the metal catalyst layer crystallizes the amorphous silicon into polycrystal silicon, the capping layer can be removed selectively. Wet etching or dry etching can be used for removing capping. After the polycrystal silicon is formed, a via hole (not shown) is formed on the interlayer dielectric layer 170e, 120e which will be explained below, and then impurities are injected into the crystallized polycrystal silicon through the via hole, and the metal catalyst impurities formed inside of it can be eliminated. Here, the method for eliminating the metal catalyst impurities is called a gettering process. This gettering process includes a heating process for heating the thin film transistor at a low temperature as well as the process for injecting impurities. Through such a gettering process, an excellent thin film transistor can be realized.

The micro silicon has a size of a crystallization particle which ranges from the size of the amorphous silicon to that of the polycrystal silicon, the size of 1 nm-100 nm is commonly employed. The electron mobility of the micro silicon is more than 1 and less than 50, and the hole mobility is more than 0.01 and less than 0.2. Since the size of a crystallization particle is smaller as compared with the polycrystal silicon, and the protrusion region of the crystallization particles is small, when the electrons move between the crystallization particles, there are no problems and thus uniform characteristics can be exhibited.

A thermal crystallization method and a laser crystallization method can be enumerated as methods related to the crystallization particles of the micro silicon. The thermal crystallization method is classified into the method for obtaining a crystallization structure, substantially simultaneously depositing the amorphous silicon, and the reheating method. The laser crystallization method is the method for obtaining a crystallization structure by using a laser after processing the amorphous silicon by a chemical vapor deposition, and at this time, a diode laser may be used as a laser. The diode laser may use a red wavelength of 800 nm band, and the laser enables the crystallization particles of the micro silicon to be crystallized substantially uniformly.

In the polycrystal silicon formed by using the above-mentioned methods, the desired area of the semiconductor layer 170b, 120b are formed at a desired position through the patterning step. The patterning step of the polycrystal silicon includes the processes such as a photoresist coating, exposure, development, etching and a photoresist peeling.

Referring to FIG. 7c, the step S3 of forming a gate insulating layer, the gate insulating layer 170c, 120c having a predetermined thickness are formed on the upper side of the semiconductor layer 170b, 120b. The gate insulating layer 170c, 120c can be formed on the pixel region 110a and the non-pixel region 110b of the substrate 110, simultaneously or respectively. Here, the gate insulating layer 170c, 120c can be formed on the upper side of the buffer layer 170a, 120a which is inner circumference of the semiconductor layer 170b, 120b. The gate insulating layer 170c, 120c can be formed by at least one of PECVD, LPCVD, sputtering, and the equivalents thereof. Here, the gate insulating layer 170c, 120c can be formed by at least one of a silicon oxidation film (SiO2), a silicon nitration film (Si3N4), an inorganic layer and the equivalents thereof, but the present invention does not limit the materials of the gate insulating layer 170c 120c.

Referring to FIG. 7d, at the step S4 of forming a gate electrode, the gate electrode 170d, 120d is formed at the positions corresponding to the semiconductor layer 170b, 120b on the upper sides of the gate insulating layer 170c, 120c of the pixel region 110a and the non-pixel region 110b. The gate electrode 170d, 120d can be deposited on the upper side of the gate insulating layer 170c, 120c by at least one method from PECVD, LPCVD, sputtering, and the equivalents thereof. After the gate electrode 170d, 120d is deposited on the upper side of the gate insulating layer 170c, 120c, desired areas of it can be formed at the desired positions through the processes such as a photoresist coating, exposure, development, etching and a photoresist peeling. This gate electrode 170d, 120d can be formed by any of a common metal (Mo, MoW, Ti, Cu, Al, AlNd, Cr, Mo alloy, Cu alloy, Al alloy and etc.), and the doped polycrystal silicon and the equivalents thereof, but the present invention does not limit the materials of the gate electrode 170d, 120d.

Referring to FIG. 7e, at the step S5 of forming an interlayer dielectric layer, the interlayer dielectric layer 170e, 120e are formed on the upper side of the gate electrode 170d, 120d of each of the pixel region 110a and the non-pixel region 110b. The interlayer dielectric layer 170e, 120e can be formed on the gate insulating layer 170c, 120c and the gate electrode 170d, 120d. Here, a contact hole can be formed on the interlayer dielectric layer 170e, 120e by an etching process for coupling the semiconductor layer 170b, 120b and the source/drain electrode 170f, 120f which will be explained below. The interlayer dielectric layer 170e, 120e can be formed by any one of a polymer group, a plastic group, a glass group, and the equivalent groups, but the present invention does not limit the materials of the interlayer dielectric layer 170e, 120e.

Referring to FIG. 7f, at the step S6 of forming a source/drain electrode, the source/drain electrode 170f, 120f and the conductive contact c2, c1 are formed on the upper side of the interlayer dielectric layer 170e, 120e of each of the pixel region 110a and the non-pixel region 110b. The source/drain electrode 170f, 120f can be deposited by at least one method from PECVD, LPCVD, sputtering, and the equivalents thereof, and subsequently, a desired area of it can be patterned at the desired positions through a processes such as a photoresist coating, exposure, development, etching and a photoresist peeling. Here, the conductive contact c2, c1 are formed by filling the conductive material into the contact hole formed at the step S5 of forming an interlayer dielectric layer. The conductive contact c2, c1 can be formed by the metal material identical to those of the gate electrode 170d, 120d and the source/drain electrode 170f, 120f, and the present invention does not limit the materials of the conductive contact c2, c1. In connection with the source/drain electrode 170f of the pixel region 110a, the source region (not shown) and the drain region (not shown) of the semiconductor layer 170b can be formed independently, but in connection with the source/drain electrode 120f of the non-pixel region 110b, an electrode contacting with the source region and the drain region is integrally formed. Therefore, when a general driving voltage is applied, the electrostatic discharge circuit 120 does not operate.

According to one embodiment, referring to FIG. 8, the thin film transistor 170 is formed on the pixel region 110a of the substrate 110 for providing a driving current to an organic light emitting diode 180, and the electrostatic discharge circuit 120 is formed on the non-pixel region 110b for preventing the thin film transistor 170 and the organic light emitting diode 180 from being damaged due to the electrostatic discharge.

A protective layer 170g, 120g and a planarization layer 170h, 120h can be further formed on the upper side of the source/drain electrode 170f, 120f formed on the region of the pixel region 110a and the non-pixel region 110b, respectively. The pixel region 110a and the non-pixel region 110b can be formed such that they can be coupled to the organic light emitting diode 180 and the electrode 210i through the conductive via hole v2, v1.

The pixel region 110a may be formed near the center portion of the substrate 110, the pixels included in the pixel region 110a each include at least one thin film transistor 170. Here, the electrostatic discharge circuit 120 formed on the non-pixel region 110b is formed along at least one edge region of the substrate 110 outside of the pixel region 110a.

According to the above-mentioned fabricating method, since the electrostatic discharge circuit 120 can be fabricated by a method almost identical to that of the thin film transistor 170, the present invention is very efficient in terms of the cost and the time for fabricating the organic light emitting diode display 100.

Once the electrostatic discharge circuit 120 is at least partially formed, the thin film transistor 170 and the organic light emitting diode 180 can be protected from the static electricity which can be generated during the process for forming the conductive via hole v2 for coupling the thin film transistor 170 and the organic light emitting diode 180 of the pixel region 110a. The electrostatic discharge circuit 120 can prevent at least one driver (refer to 130, 140, 150 of FIG. 1) formed on the non-pixel region 110b from being damaged due to the electrostatic discharge.

Figure 9:
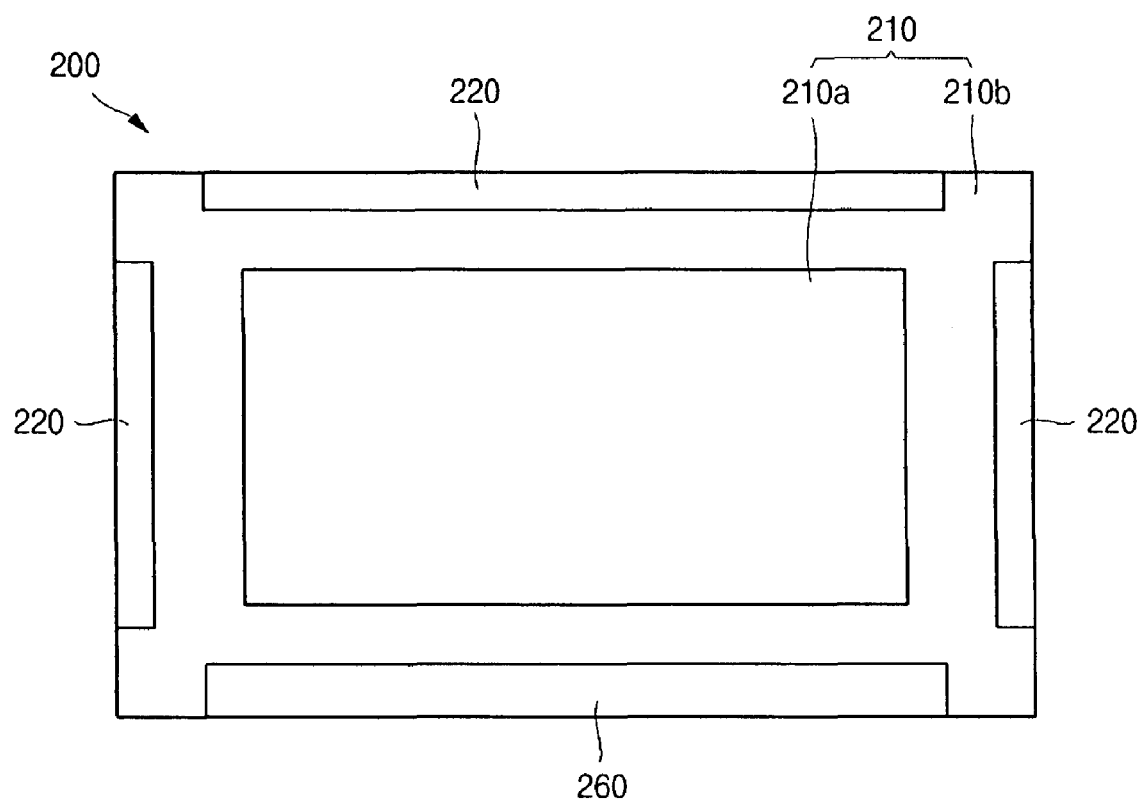
FIG. 9 illustrates a schematic diagram of an organic light emitting diode display according to one embodiment.

FIG. 9 illustrates a schematic diagram of an organic light emitting diode display according to another embodiment.

Referring to FIG. 9, the organic light emitting diode display 200 according to another embodiment includes an electrostatic discharge circuit 220 which is formed independently on each side of the substrate 210 including the pixel region 210a and the non-pixel region 210b. Therefore, there is an advantage that the electrostatic discharge circuit 220 can be selectively formed only on the region, in which the electrostatic discharge is frequently generated, or other desired regions. The electrostatic discharge circuit 220 can be coupled to the ground pad (not shown) of the pad unit 260 formed on the substrate 210. The specific structure of the electrostatic discharge circuit 220 is formed similar to that described above.

In connection with the method for fabricating the above-mentioned organic light emitting diode display 100, explanation is made with concentrating on a front light-emitting method which emits lights toward the upper direction of the substrate 110, but the present invention is not limited to this method, and embodiments can be applied to both the back light-emitting method which emits lights toward the lower direction of the substrate 110 and the method which emits lights toward the upper and the lower directions of the substrate 110 simultaneously.

According to some embodiments, since the organic light emitting diode display includes an electrostatic discharge circuit formed on at least one side of a substrate, the pixels or the drivers can be prevented from being damaged by the electrostatic discharge generated due to the internal reasons and other external environment during the manufacturing processes.

The organic light emitting diode of some embodiments is composed of an anode (ITO), an organic layer and a cathode (metal). The organic layer can include an emitting layer (EML) in which a hole and an electron contact, such that an exciton is formed to emit a light, an electron transport layer (ETL) for transporting an electron, and a hole transport layer (HTL) transporting a hole. Further, an electron injecting layer (EIL) for injecting the electrons is formed on one side of the electron transport layer, and a hole injecting layer (HIL) for injecting the holes can be further formed on one side of the hole transport layer. In addition, in case of a phosphorescence organic light emitting diode, a hole blocking layer (HBL) can be selectively formed between the emitting layer (EML) and the electron transport layer (ETL), and an electron blocking layer (EBL) can be selectively formed between the emitting layer (EML) and the hole transport layer (HTL).

Further, the organic layer can also be formed as a slim OLED structure which is formed with multiple layers. For example, a hole injection transport layer (HITL) structure which allows the hole injection layer and the hole transport layer to be formed simultaneously, and an electron injection transport layer (EITL) structure which allows the electron injection layer and the electron transport layer to be formed simultaneously can be selectively formed. A benefit of the organic light emitting diode of in slim type is to increase emission efficiency. Further, a buffer layer can be formed as a selection layer between the anode (ITO) and the light-emitting layer. The buffer layer can be classified into an electron buffer layer for buffering the electrons and a hole buffer layer for buffering the holes.

The electron buffer layer can be selectively formed between the cathode (Metal) and the electron injection layer (EIL), and can be formed instead of the electron injection layer (EIL). Here, the stack structure of the organic layer can include the emitting layer (EML)/the electron transport layer (ETL)/the electron buffer layer/a cathode (Metal). Further, the hole buffer layer can be selectively formed between an anode (ITO) and the hole injection layer (HIL) and can be formed instead of the hole injection layer (HIL). Here, the stack structure of the organic layer can include the anode (ITO)/a hole buffer layer/the hole transport layer (HTL)/the emitting layer (EML).

In connection with the above structure, some stack structures which can be used are as follows.

a) Normal Stack Structure
1) an anode/a hole injection layer/a hole transport layer/a light emitting layer/an electron transport layer/an electron injection layer/a cathode.
2) an anode/a hole buffer layer/a hole injection layer/a hole transport layer/a light emitting layer/an electron transport layer/an electron injection layer/a cathode.
3) an anode/a hole injection layer/a hole transport layer/a light emitting layer/an electron transport layer/an electron injection layer/an electron buffer layer/a cathode.
4) an anode/a hole buffer layer/a hole injection layer/a hole transport layer/a light emitting layer/an electron transport layer/an electron injection layer/an electron buffer layer/a cathode.
5) an anode/a hole injection layer/a hole buffer layer/a hole transport layer/a light emitting layer/an electron transport layer/an electron injection layer/a cathode.
6) an anode/a hole injection layer/a hole transport layer/a light emitting layer/an electron transport layer/an electron buffer layer/an electron injection layer/a cathode.

b) Normal Slim Structure
1) an anode/a hole injection and transport layer/a light emitting layer/an electron transport layer/an electron injection layer/a cathode.
2) an anode/a hole buffer layer/a hole injection and transport layer/a light emitting layer/an electron transport layer/an electron injection layer/a cathode.
3) an anode/a hole injection layer/a hole transport layer/a light emitting layer/an electron injection layer/an electron buffer layer/a cathode.
4) an anode/a hole buffer layer/a hole transport layer/a light emitting layer/an electron injection and transport layer/an electron buffer layer/a cathode.
5) an anode/a hole injection and transport layer/a hole buffer layer/a light emitting layer/an electron transport layer/an electron injection layer/a cathode.
6) an anode/a hole injection layer/a hole transport layer/a light emitting layer/an electron buffer layer/an electron injection and transport layer/a cathode.

c) Inverted Stack Structure
1) a cathode/an electron injection layer/an electron transport layer/a light emitting layer/a hole transport layer/a hole injection layer/an anode.
2) a cathode/an electron injection layer/an electron transport layer/a light emitting layer/a hole transport layer/a hole injection layer/a hole buffer layer/an anode.
3) a cathode/an electron buffer layer/an electron injection layer/an electron transport layer/a light emitting layer/a hole transport layer/a hole injection layer/an anode.
4) a cathode/an electron buffer layer/an electron injection layer/an electron transport layer/a light emitting layer/a hole transport layer/a hole buffer layer/an anode.
5) a cathode/an electron injection layer/an electron transport layer/a light emitting layer/a hole transport layer/a hole buffer layer/a hole injection layer/an anode.
6) a cathode/an electron injection layer/an electron buffer layer/an electron transport layer/a light emitting layer/a hole transport layer/a hole injection layer/an anode.

d) Inverted Slim Structure
1) a cathode/an electron injection layer/an electron transport layer/a light emitting layer/a hole injection and transport layer/an anode.
2) a cathode/an electron injection layer/an electron transport layer/a light emitting layer/a hole injection and transport layer/a hole buffer layer/an anode.
3) a cathode/an electron buffer layer/an electron injection and transport layer/a light emitting layer/a hole transport layer/a hole injection layer/an anode.
4) a cathode/an electron buffer layer/an electron injection and transport layer/a light emitting layer/a hole transport layer/a hole buffer layer/an anode.
5) a cathode/an electron injection layer/an electron transport layer/a light emitting layer/a hole buffer layer/a hole injection and transport layer/an anode.
6) a cathode/an electron injection and transport layer/an electron buffer layer/a light emitting layer/a hole transport layer/a hole injection layer/an anode.

A passive matrix method and an active matrix method are widely known as a method for driving such an organic light emitting diode. In the case of the passive matrix method, there is an advantage that the processes are simple and the investment money is very small since the anode and the cathode are crossed and driving is performed by a line selection, but much current consumption is required for realizing a large screen. In the case of the active matrix method, there is an advantage that the current consumption is not so much required, the screen quality and the lifespan are very superb, and it can be applied to a middle screen and a large screen since the active element such as the thin film transistor and the storage capacitor are formed on each pixel.

The present invention is not limited to the above-mentioned specific preferred embodiments, and it is natural that various kinds of modifications can be realized by the person having the common knowledge in the art to which the present invention pertains without deviating from the spirit of the present invention.

As illustrated above, in the organic light emitting diode display and the fabrication method thereof, there is an effect that the pixels and the drivers can be prevented from being damaged due to the electrostatic discharge since an electrostatic discharge circuit is formed on at least one side of a substrate.

Accordingly, there may be an effect that a static electricity having a relatively high voltage level can be controlled, since the horizontal distance between the source/drain electrode and the gate electrode of an electrostatic discharge circuit is controlled.

Accordingly, there may be an effect that the electrostatic discharge of the organic light emitting diode display can be protected since the gate insulating layer and the interlayer dielectric layer included in an electrostatic discharge circuit induces a dielectric breakdown from the static electricity generated between the source/drain electrode and the semiconductor layer or the gate electrode and the semiconductor.

Further, there may be an efficient effect in terms of the cost and the time required for fabricating the organic light emitting diode display since an electrostatic discharge circuit of the non-pixel region is formed by a fabricating method similar to the fabricating method of the thin film transistor of the pixel region.

What is claimed is:

1. An organic light emitting diode display, comprising:
   a substrate including a pixel region and a non-pixel region; and
   an electrostatic discharge circuit formed in the non-pixel region of the substrate, wherein the electrostatic discharge circuit comprises:
      a semiconductor layer formed on the substrate,
      a gate insulating layer formed on the semiconductor layer,
      a gate electrode formed on the gate insulating layer and at least partly overlapping the semiconductor layer,
      an interlayer dielectric layer formed on the gate electrode, and
      first and second source/drain electrodes formed on the interlayer dielectric layer, wherein at least the first source/drain electrode at least partly overlaps the semiconductor layer, wherein at least a portion of the first source/drain electrode overlapping the semiconductor layer does not overlap the gate electrode, and wherein the portion of the first source/drain electrode overlapping the semiconductor layer is spaced apart from the portion of the gate electrode overlapping the semiconductor layer in a direction, wherein the direction is both substantially parallel to the substrate and substantially perpendicular to a line intersecting the first and second source/drain electrodes.

2. The organic light emitting diode display as claimed in claim 1, wherein the first source/drain electrode is spaced apart from the gate electrode by a distance l1 in the direction by about 1μm to about 10μm.

3. The organic light emitting diode display as claimed in claim 1, wherein the non-pixel region further comprises:
   at least one driver configured to drive a pixel of the pixel region; and
   a pad unit configured to electrically couple the pixel and the driver to an external module.

4. The organic light emitting diode display as claimed in claim 3, wherein the pad unit is formed along at least one edge region of the substrate.

5. The organic light emitting diode display as claimed in claim 4, wherein the electrostatic discharge circuit is formed along another edge region of the substrate.

6. The organic light emitting diode display as claimed in claim 4, wherein the electrostatic discharge circuit is formed along each edge of the substrate.

7. The organic light emitting diode display as claimed in claim 1, wherein the electrostatic discharge circuit is configured to protect pixels in the pixel region.

8. The organic light emitting diode display as claimed in claim 3, wherein the gate electrode is coupled to a ground pad formed on the pad unit.

9. The organic light emitting diode display as claimed in claim 1, wherein the electrostatic discharge circuit further comprises a buffer layer formed between the substrate and the semiconductor layer.

10. The organic light emitting diode display as claimed in claim 1, wherein the electrostatic discharge circuit further comprises a protective layer on at least one of the source/drain electrodes.

11. The organic light emitting diode display as claimed in claim 1, wherein the electrostatic discharge circuit further comprises a conductive contact for electrically coupling at least one of the source/drain electrodes and the semiconductor layer.

12. The organic light emitting diode display as claimed in claim 10, wherein the electrostatic discharge circuit further comprises an electrode layer formed on the protective layer.

13. The organic light emitting diode display as claimed in claim 12, wherein the electrode layer is coupled to the at least one source/drain electrode through a conductive via hole.

14. The organic light emitting diode display as claimed in claim 1, further comprising:
   a first discharge path between at least one of the first and second source/drain electrodes and the gate electrode;
   a second discharge path between at least one of the first and second source/drain electrodes and the semiconductor layer; and
   a third discharge path between the gate electrode and the semiconductor layer.

15. A method of fabricating an organic light emitting display, the method comprising:
   determining a pixel region and a non-pixel region on a substrate;
   forming a semiconductor layer on each of the pixel region and the non-pixel region;
   forming a gate insulating layer on each of the semiconductor layers of the pixel region and the non-pixel region;
   forming a gate electrode on each of the gate insulating layers of the pixel region and the non-pixel region;
   forming an interlayer dielectric layer covering each of the gate electrodes of the pixel region and the non-pixel region; and
   forming a source/drain electrode on each of the interlayer dielectric layers of the pixel region and the non-pixel region,
   wherein at least a thin film transistor is formed in the pixel region, and an electrostatic discharge circuit is formed in the non-pixel region,
   wherein forming the thin film transistor comprises:
      forming a semiconductor layer on the substrate,
      forming a gate insulating layer on the semiconductor layer, forming a gate electrode on the gate insulating layer and at least partly overlapping the semiconductor layer, forming an interlayer dielectric layer on the gate electrode, and forming first and second source/drain electrodes on the interlayer dielectric layer, wherein at least the first source/drain electrode at least partly overlaps the semiconductor layer, wherein at least a portion of the first source/drain electrode overlapping the semiconductor layer does not overlap the gate electrode, and wherein the portion of the first source/drain electrode overlapping the semiconductor layer is spaced apart from the portion of the gate electrode overlapping the semiconductor layer in a direction, wherein the direction is both substantially parallel to the substrate and substantially perpendicular to a line intersecting the first and second source/drain electrodes.

16. The method of fabricating an organic light emitting diode display as claimed in claim 15, wherein the electrostatic discharge circuit and the thin film transistor are formed with the same layers.

17. The method of fabricating an organic light emitting diode display as claimed in claim 15, wherein the first source/drain electrode of the non-pixel region is spaced apart from the gate electrode of the non-pixel region by a distance 11 in the direction by about 1μm to about 10μm.

18. The method of fabricating an organic light emitting diode display as claimed in claim 15, wherein the non-pixel region further comprises:
   at least one driver configured to drive a pixel of the pixel region; and
   a pad unit configured to electrically couple the pixel and the driver to an external module.

19. The method of fabricating an organic light emitting diode display as claimed in claim 18, wherein the pad unit is formed along at least one edge region of the substrate.

20. The method of fabricating an organic light emitting diode display as claimed in claim 19, wherein the electrostatic discharge circuit is formed along another edge region of the substrate.

21. The method of fabricating an organic light emitting diode display as claimed in claim 20, wherein the electrostatic discharge circuit is independently formed along each edge region of the substrate.

22. The method of fabricating an organic light emitting diode display as claimed in claim 20, wherein the electrostatic discharge circuit is integrally formed along at least one edge region of the substrate.

23. The method of fabricating an organic light emitting diode display as claimed in claim 18, wherein the gate electrode is coupled to a ground pad formed on the pad unit.

24. The method of fabricating an organic light emitting diode display as claimed in claim 15, wherein the electrostatic discharge circuit further comprises a buffer layer formed between the substrate and the semiconductor layer.

25. The method of fabricating an organic light emitting diode display as claimed in claim 15, wherein the electrostatic discharge circuit further comprises a protective layer on at least one of the source/drain electrodes.

26. The method of fabricating an organic light emitting diode display as claimed in claim 15, wherein the electrostatic discharge circuit further comprises a conductive contact for electrically coupling at least one of the source/drain electrodes and the semiconductor layer.

27. The method of fabricating an organic light emitting diode display as claimed in claim 25, wherein the electrostatic discharge circuit further comprises an electrode layer formed on the protective layer.

28. The method of fabricating an organic light emitting diode display as claimed in claim 27, wherein the electrode layer is coupled to at least one of the source/drain electrodes through a conductive via hole.

29. The method of fabricating an organic light emitting diode display as claimed in claim 15, further comprising:
   forming a first discharge path between at least one of the first and second source/drain electrodes and the gate electrode;
   forming a second discharge path between at least one of the first and second source/drain electrodes and the semiconductor layer; and
   forming a third discharge path between the gate electrode and the semiconductor layer.

* * * * *